US009423463B2

United States Patent
Burke

(10) Patent No.: US 9,423,463 B2
(45) Date of Patent: Aug. 23, 2016

(54) METHOD AND CONTROL UNIT FOR AN ELECTRIC MOTOR OR GENERATOR

(71) Applicant: PROTEAN ELECTRIC LIMITED, Surrey (GB)

(72) Inventor: Richard Thomas Burke, Hook (GB)

(73) Assignee: PROTEAN ELECTRIC LIMITED (GB)

( * ) Notice: Subject to any disclaimer, the term of this patent is extended or adjusted under 35 U.S.C. 154(b) by 0 days.

(21) Appl. No.: 14/408,565

(22) PCT Filed: Jun. 11, 2013

(86) PCT No.: PCT/IB2013/054782
§ 371 (c)(1),
(2) Date: Dec. 16, 2014

(87) PCT Pub. No.: WO2013/190429
PCT Pub. Date: Dec. 27, 2013

(65) Prior Publication Data
US 2015/0185288 A1    Jul. 2, 2015

(30) Foreign Application Priority Data
Jun. 18, 2012    (GB) .................................. 1210799.1

(51) Int. Cl.
| H02P 31/00 | (2006.01) |
| G01R 31/34 | (2006.01) |
| H02P 29/02 | (2016.01) |
| B60L 3/00 | (2006.01) |
| B60L 15/02 | (2006.01) |

(52) U.S. Cl.
CPC ............. *G01R 31/343* (2013.01); *B60L 3/0061* (2013.01); *B60L 15/025* (2013.01); *H02P 29/027* (2013.01); *H02P 31/00* (2013.01); *Y02T 10/643* (2013.01)

(58) Field of Classification Search
CPC ....................................................... H02P 31/00
USPC ............................................ 318/490, 34, 558
See application file for complete search history.

(56) References Cited

U.S. PATENT DOCUMENTS

| 6,388,416 B1 * | 5/2002 | Nakatani et al. ............... 318/700 |
| 6,392,418 B1 | 5/2002 | Mir et al. |
| 7,342,367 B2 * | 3/2008 | Suzuki ..................... H02P 23/22 318/400.04 |

(Continued)

OTHER PUBLICATIONS

Daniel Closa, International Search Report, WIPO, Nov. 29, 2013, 3, UK.
Daniel Closa, PCT International Search Report, WIPO, Nov. 29, 2013, 3, UK.
Rowland Hunt, Combined Search and Examination Report under Sections 17 & 18(3), IPO, Aug. 7, 2012, 1, UK.
Rowland Hunt, Search Report under Section 17, IPO, Aug. 6, 2012, 1, UK.

*Primary Examiner* — David S Luo
(74) *Attorney, Agent, or Firm* — The Mason Group Patent Specialists LLC; Valerie M. Davis

(57) ABSTRACT

A control unit for identifying a fault in an electric motor or generator, the control unit comprising means for measuring a value of a first parameter associated with the operation of the electric motor or generator; means for increasing a counter value if the difference between the measured first parameter value or a value derived from the measured value and a second value is greater than a first predetermined value; means for decreasing the counter value if the difference between the measured first parameter value and the second value is less than the first predetermined value; and means for generating a signal indicative of a fault if the counter value exceeds a second predetermined value.

29 Claims, 5 Drawing Sheets

(56) References Cited

U.S. PATENT DOCUMENTS

| | | |
|---|---|---|
| 2005/0049770 A1 | 3/2005 | Liu et al. |
| 2006/0122796 A1 | 6/2006 | McLaughlin et al. |
| 2008/0211450 A1 | 9/2008 | Yamada et al. |
| 2010/0066551 A1 | 3/2010 | Bailey et al. |
| 2012/0074879 A1 | 3/2012 | Fahimi et al. |

* cited by examiner

METHOD AND CONTROL UNIT FOR AN ELECTRIC MOTOR OR GENERATOR

The present invention relates to a control unit for an electric motor or generator and in particular a control unit for identifying a fault in an electric motor or generator.

With increased interested being placed in environmentally friendly vehicles there has been a corresponding increase in interest in the use of electric vehicles.

Electric vehicles typically use an electric motor to provide both drive for the vehicle and regenerative braking for stopping the vehicle. To effect regenerative braking, rotary motion of a drive wheel connected to an electric motor is converted into electric energy.

However, when using an electric motor in an automotive application it is desirable that the electric motor does not cause unintended acceleration or braking to occur.

Accordingly, it is desirable for an electric motor to have sensors for measuring/monitoring electric motor parameters, where a fault will typically be identified if an electric motor parameter exceeds a threshold value.

However, by determining whether a fault has occurred based directly on measured parameter values can result in one off spurious measurements being incorrectly identified as a fault. Further the types of faults identifiable in an electric motor will be limited by the number of parameters being measured.

It is desirable to improve this situation.

In accordance with an aspect of the present invention there is provided a method and a control unit for an electric motor or generator according to the accompanying claims.

The invention as claimed provides the advantage of reducing the risk of falsely identifying transient or noise conditions or spurious one off measurements within an electric motor as fault conditions.

The present invention will now be described, by way of example, with reference to the accompanying drawings, in which.

The embodiment of the invention described is a control unit for an electric motor for use in a wheel of a vehicle. However, the control unit can be located remotely to the electric motor. The motor is of the type having a set of coils being part of the stator for attachment to a vehicle, radially surrounded by a rotor carrying a set of magnets for attachment to a wheel. For the avoidance of doubt, the various aspects of the invention are equally applicable to an electric generator having the same arrangement. As such, the definition of electric motor is intended to include electric generator. In addition, some of the aspects of the invention are applicable to an arrangement having the rotor centrally mounted within radially surrounding coils. As would be appreciated by a person skilled in the art, the present invention is applicable for use with other types of electric motors.

Figure 1:
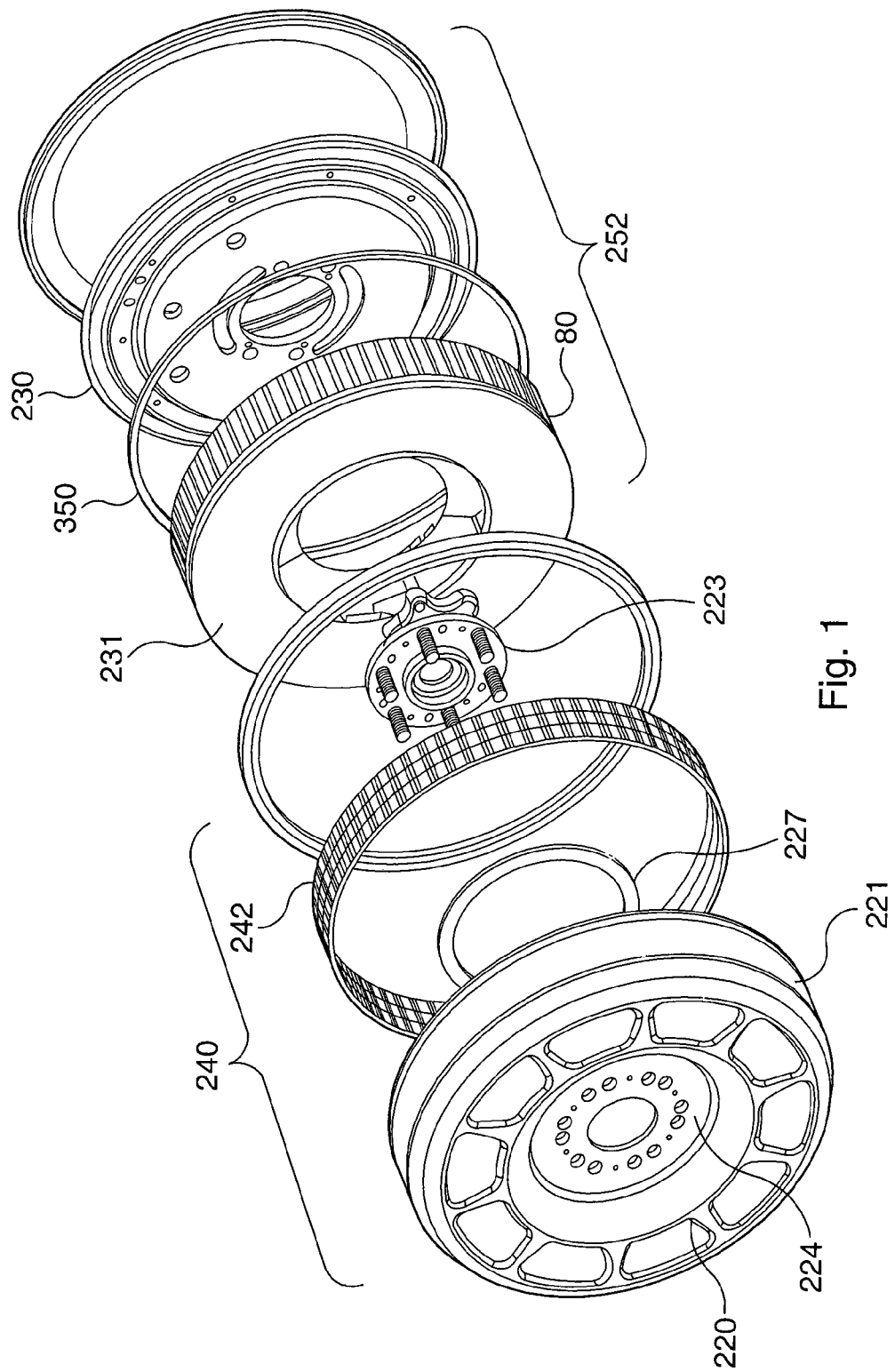
FIG. 1 illustrates an exploded view of an electric motor as used in an embodiment of the present invention.

For the purposes of the present embodiment, as illustrated in FIG. 1, the in-wheel electric motor 40 includes a stator 252 comprising a rear portion 230 forming a first part of the housing of the assembly, and a heat sink and drive arrangement 231 comprising multiple coils and electronics to drive the coils. The coil drive arrangement 231 is fixed to the rear portion 230 to form the stator 252 which may then be fixed to a vehicle and does not rotate relative to the vehicle during use. The coils themselves are formed on tooth laminations to form coil windings, which together with the drive arrangement 231 and rear portion 230 form the stator 252.

A rotor 240 comprises a front portion 220 and a cylindrical portion 221 forming a cover, which substantially surrounds the stator 252. The rotor includes a plurality of permanent magnets 242 arranged around the inside of the cylindrical portion 221. For the purposes of the present embodiment 32 magnet pairs are mounted on the inside of the cylindrical portion 221. However, any number of magnet pairs may be used.

The magnets are in close proximity to the coils on the assembly 231 so that magnetic fields generated by the coils in the assembly 231 interact with the magnets 242 arranged around the inside of the cylindrical portion 221 of the rotor 240 to cause the rotor 240 to rotate. As the permanent magnets 242 are utilized to generate a drive torque for driving the electric motor, the permanent magnets are typically called drive magnets.

The rotor 240 is attached to the stator 252 by a bearing block 223. The bearing block 223 can be a standard bearing block as would be used in a vehicle to which this motor assembly is to be fitted. The bearing block comprises two parts, a first part fixed to the stator and a second part fixed to the rotor. The bearing block is fixed to a central portion 233 of the wall 230 of the stator 252 and also to a central portion 225 of the housing wall 220 of the rotor 240. The rotor 240 is thus rotationally fixed to the vehicle with which it is to be used via the bearing block 223 at the central portion 225 of the rotor 240. This has an advantage in that a wheel rim and tyre can then be fixed to the rotor 240 at the central portion 225 using the normal wheel bolts to fix the wheel rim to the central portion of the rotor and consequently firmly onto the rotatable side of the bearing block 223. The wheel bolts may be fitted through the central portion 225 of the rotor through into the bearing block itself. With both the rotor 240 and the wheel being mounted to the bearing block 223 there is a one to one correspondence between the angle of rotation of the rotor and the wheel.

Figure 2:
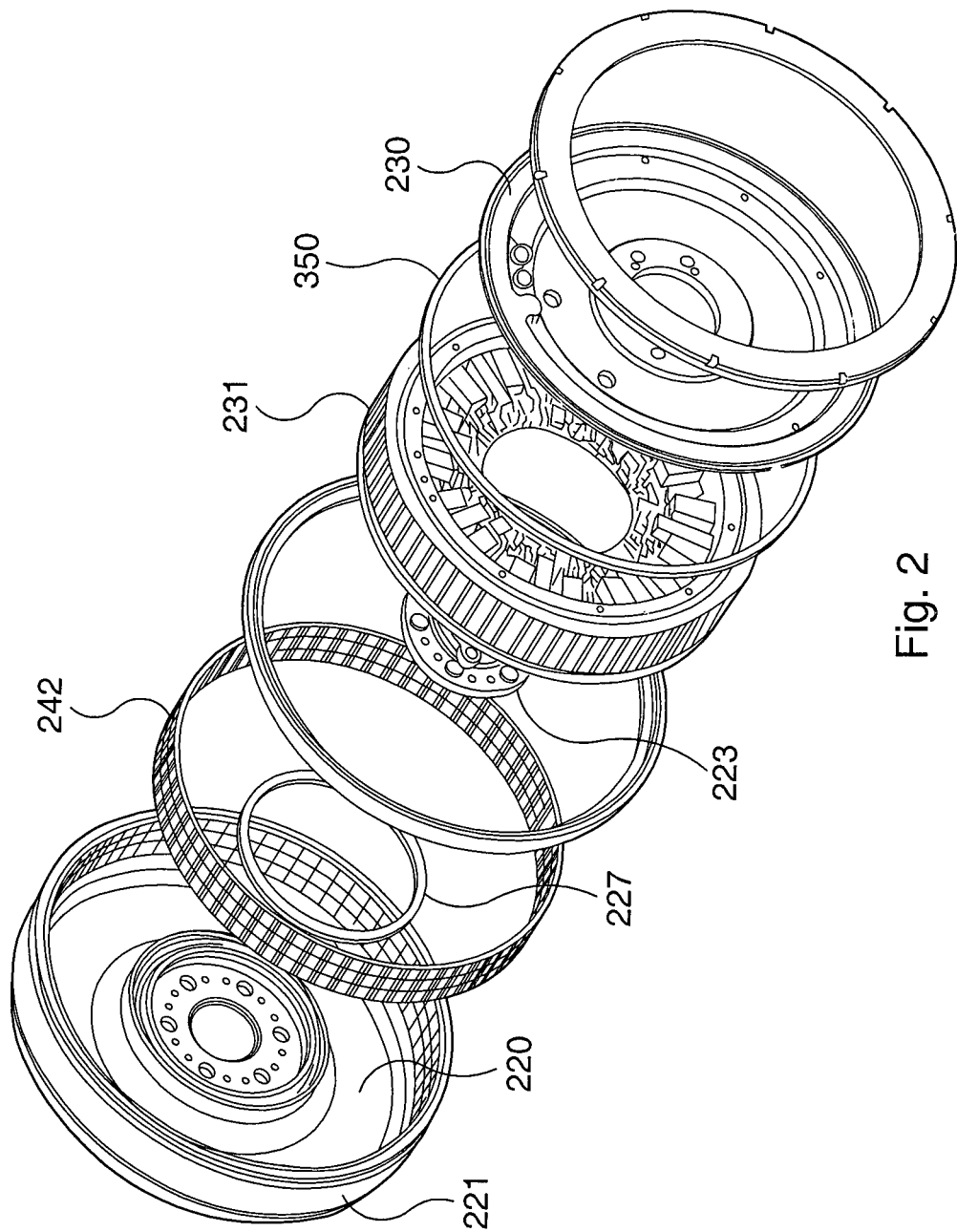
FIG. 2 illustrates an exploded view of the electric motor shown in FIG. 1 from an alternative angle.

FIG. 2 shows an exploded view of the same assembly as FIG. 1 from the opposite side showing the stator 252 comprising the rear stator wall 230 and coil and electronics assembly 231. The rotor 240 comprises the outer rotor wall 220 and circumferential wall 221 within which magnets 242 are circumferentially arranged. As previously described, the stator 252 is connected to the rotor 240 via the bearing block at the central portions of the rotor and stator walls.

Additionally shown in FIG. 1 are control devices 80 carrying control electronics, otherwise known as motor drive controllers or inverters.

A V shaped seal 350 is provided between the circumferential wall 221 of the rotor and the outer edge of the stator housing 230.

The rotor also includes a set of magnets 227 for position sensing, otherwise known as commutation magnets, which in conjunction with sensors mounted on the stator allows for a rotor flux angle to be estimated. The rotor flux angle defines the positional relationship of the drive magnets to the coil windings. Alternatively, in place of a set of separate magnets the rotor may include a ring of magnetic material that has multiple poles that act as a set of separate magnets.

To allow the commutation magnets to be used to calculate a rotor flux angle, preferably each drive magnet has an associated commutation magnet, where the rotor flux angle is derived from the flux angle associated with the set of commutation magnets by calibrating the measured commutation magnet flux angle. To simplify the correlation between the commutation magnet flux angle and the rotor flux angle, preferably the set of commutation magnets has the same number of magnet or magnet pole pairs as the set of drive magnet pairs, where the commutation magnets and associated drive magnets are approximately radially aligned with each other. Accordingly, for the purposes of the present embodiment the set of commutation magnets has 32 magnet pairs, where each magnet pair is approximately radially aligned with a respective drive magnet pair.

A sensor, which in this embodiment is a Hall sensor, is mounted on the stator. The sensor is positioned so that as the rotor rotates each of the commutation magnets that form the commutation magnet ring respectively rotates past the sensor.

As the rotor rotates relative to the stator the commutation magnets correspondingly rotate past the sensor with the Hall sensor outputting an AC voltage signal, where the sensor outputs a complete voltage cycle of 360 electrical degrees for each magnet pair that passes the respective sensors.

To aid in the determination of the direction of the rotor, the sensor may also have an associated second sensor placed 90 electrical degrees apart.

Figure 3:
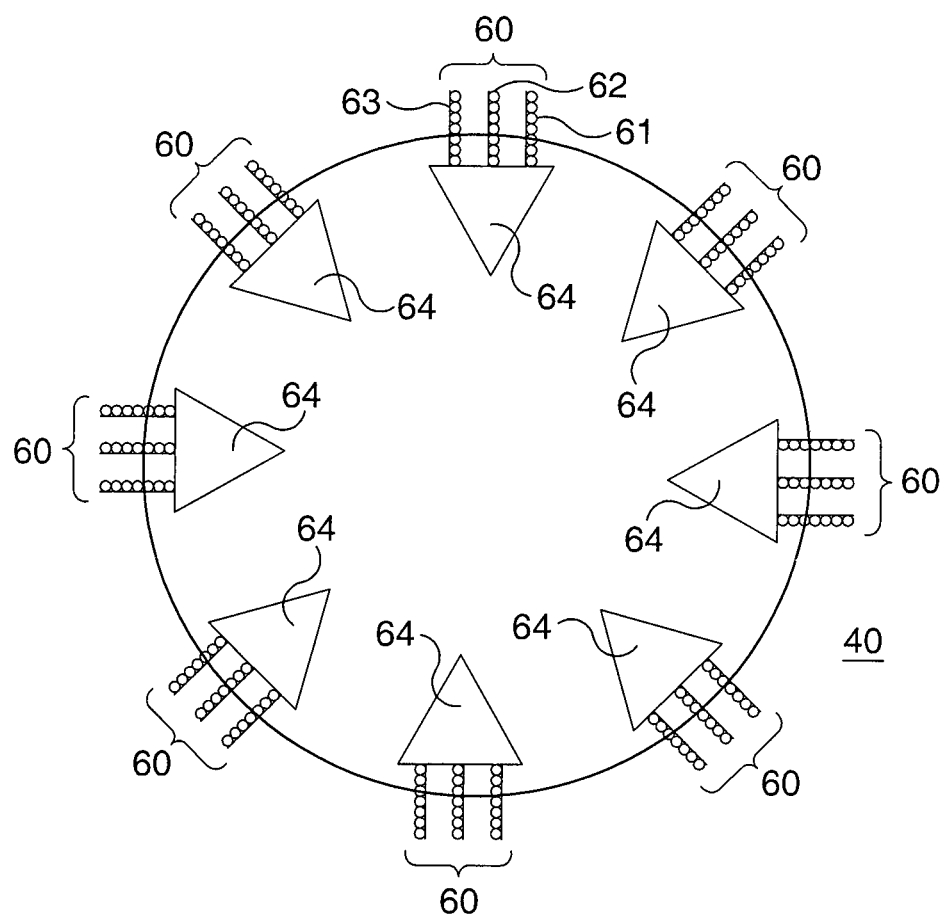
FIG. 3 illustrates an example arrangement of coil sets for an electric motor according to an embodiment of the present invention.

As illustrated in FIG. 3, the motor 40 in this embodiment includes 8 coil sets 60 with each coil set 60 having three coil sub-sets 61, 62, 63 that are coupled to a respective control device 80, where each control device 80 and respective coil sub-sets form a three phase logical or sub electric motor that can be controlled independently of the other sub motors. The control devices 80 drive their respective sub motor with a three phase voltage supply, thereby allowing the respective coil sub-sets to generate a rotating magnetic field. Although the present embodiment describes each coil set 60 as having three coil sub-sets 61, 62, 63, the present invention is not limited by this and it would be appreciated that each coil set 60 could have two or more coil sub-sets. Equally, although the present embodiment describes an electric motor having eight coil sets 60 (i.e. eight sub motors) the motor could have one or more coil sets with an associated control device.

Each control device includes a three phase bridge inverter which, as is well known to a person skilled in the art, contains six switches. The three phase bridge inverter is coupled to the three subset coils of a coil set 60 to form a three phase electric motor configuration. Accordingly, as stated above, the motor includes eight three phase sub-motors, where each three phase sub-motor includes a control device 80 coupled to the three sub-set coils of a coil set 60.

Each three phase bridge inverter is arranged to provide PWM voltage control across the respective coil sub-sets 61, 62, 63 to provide a required torque for the respective sub-motors.

For a given coil set the three phase bridge switches of a control device 64 are arranged to apply a single voltage phase across each of the coil sub-sets 61, 62, 63.

Although the in-wheel electric motor described in the present embodiment includes a plurality of logical sub-motors, as person skilled in the art would appreciate the electric motor may be of a conventional design without the use of logical sub-motors.

In this embodiment, each control device 80 is substantially wedge-shaped. This shape allows multiple control devices 80 to be located adjacent each other within the motor, forming a fan-like arrangement.

The control device 80 switches can include semiconductor devices such as MOSFETs or IGBTs. In the present example, the switches comprise IGBTs. However, any suitable known switching circuit can be employed for controlling the current. One well known example of such a switching circuit is the three phase bridge circuit having six switches configured to drive a three phase electric motor. The six switches are configured as three parallel sets of two switches, where each pair of switches is placed in series and from a leg of the three phase bridge circuit.

The plurality of switches are arranged to apply an alternating voltage across the respective coil sub-sets.

As described above, the plurality of switches are configured to form an n-phase bridge circuit. Accordingly, as is well known to a person skilled in the art, the number of switches will depend upon the number of voltage phases to be applied to the respective sub motors. Although the current design shows each sub motor having a three phase construction, the sub motors can be constructed to have two or more phases.

The wires (e.g. copper wires) of the coil sub-sets can be connected directly to the switching devices as appropriate.

The control device 80 includes a number of electrical components for controlling the operation of the switches mounted on the control device 80. Examples of electrical components mounted on the control device 80 include control logic for controlling the operation of the switches for providing PWM voltage control and interface components, such as a CAN interface chip, for allowing the control device 80 to communicate with devices external to the control device 80, such as other control devices 80 or a motor controller. Typically the control device 80 will communicate over the interface to receive torque demand requests and to transmit status information. Typically, the sensor for determining the rotor flux angle will be mounted on a control device 80, which in turn will be mounted to the stator. Optionally, for additional redundancy a sensor may be mounted to each control device 80.

Figure 4:
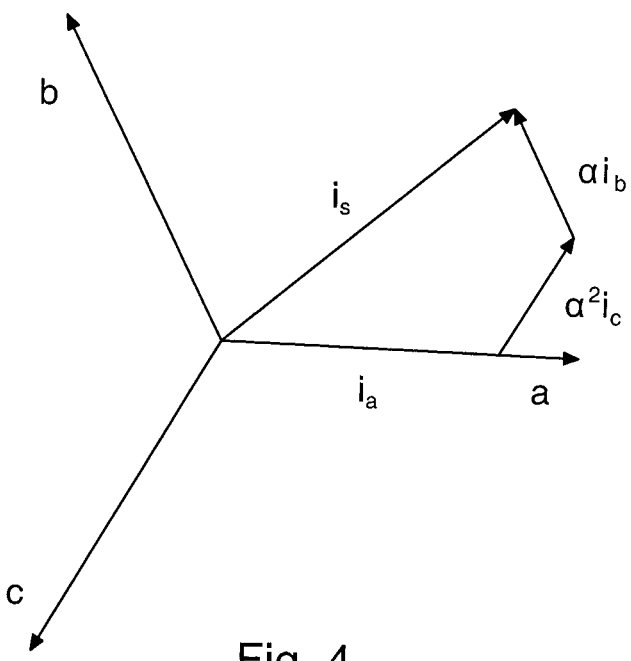
FIG. 4 illustrates a three phase stator current complex space vector.

The sinusoidal voltage waveforms generated in the electric motor by the control devices 80 under the control of a motor controller (not shown) are created using Field Orientation Control, where the resultant rotor flux and stator currents are represented by respective vectors which are separated by 120 degrees as illustrated in FIG. 4 by the three axes a, b, c.

As illustrated in FIG. 4, currents ia, ib, ic represent the instantaneous current in the respective stator coils in the A, B, and C axis of a three phase current reference frame, where the stator current vector is defined by, where $\alpha = e^{(i*2*\Pi/3)}$.

Field Oriented Control is based on projections that transform a two co-ordinate time invariant system, where a stator current or voltage component is aligned with a quadrature axis q and a magnetic flux component is aligned with a direct axis d, into a three phase time and speed dependent system and vice versa.

Figure 5:
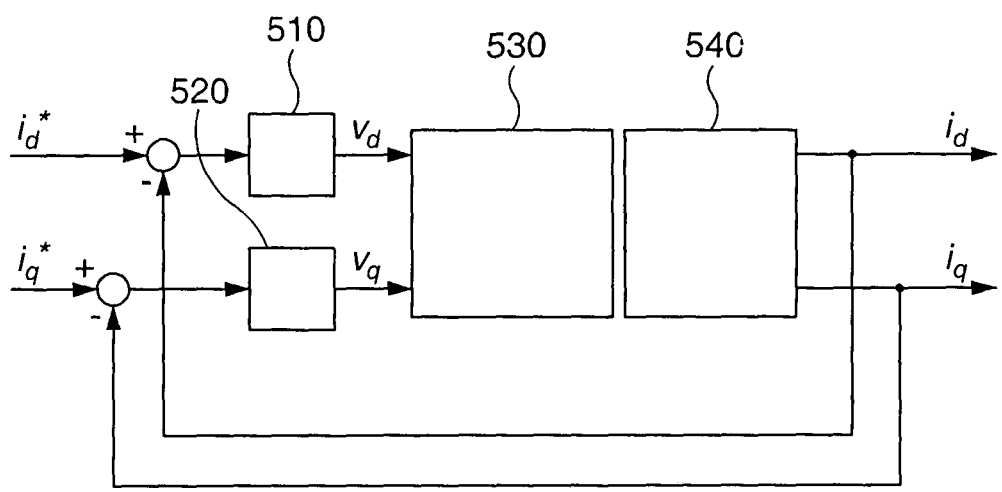
FIG. 5 illustrates a closed loop control system for an electric motor according to an embodiment of the present invention.

Using a closed loop control system, an example of one being illustrated in FIG. 5, a required torque $\tau$, which is represented by an input $i_q^*$ value, and a required magnetic flux $\lambda$, which is represented by an input $i_d^*$ value, are generated in the electric motor.

It should be noted, however, that under normal circumstances a permanent magnet synchronous electric motor will typically have $i_d$ set to zero.

The closed loop control system 100 illustrated in FIG. 5 includes a Proportional Integral PI controller located between the respective motor input id* and iq* current demands, which correspond to driver torque demand, and the coil windings of the electric motor.

The closed loop control system 100 includes current sensors for measuring current flow in the coil windings of the electric motor. To determine the corresponding id and iq current values a Clarke Transform and a Park Transform are used.

Figure 6:
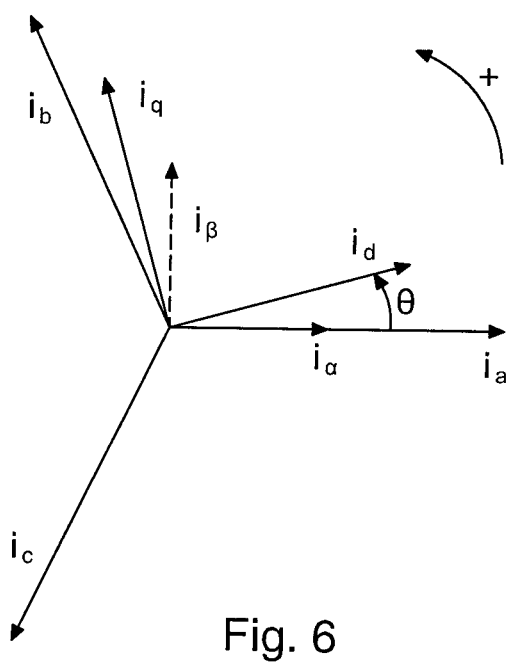
FIG. 6 illustrates a three phase stator current reference frame with a d, q rotating reference frame.

A Clarke Transform uses three phase currents ia, ib, and ic that flow in the respective stator coils, which drive the electric motor, to calculate currents in a two phase orthogonal stator axis system i$\alpha$ and i$\beta$. A Park transformation is then performed by a Park Transform to transform the two fixed co-ordinate stator axes i$\alpha$ and i$\beta$ to the two co-ordinate time invariant system id and iq, which defines a d, q rotating reference frame. FIG. 6 illustrates the relationship of the stator current in the d,q rotating reference frame with respect to the two phase orthogonal stator axes i$\alpha$ and i$\beta$ and the a, b and c stationary reference frame.

Under normal drive conditions the rotor phase angle $\theta_r$, otherwise known as rotor flux angle of the drive magnets, which is defined by the rotor magnetic flux vector $\psi_R$, and the stator electrical phase angle $\theta_e$ should ideally be aligned with the q-axis, thereby maintaining synchronization between the rotor phase angle $\theta_r$ and the stator electrical phase angle $\theta_e$.

To allow the Park Transform 102 to derive a time invariant transformation the rotor phase angle $\theta_r$ is provided to the Park Transform, where the rotor phase angle $\theta_r$ is determined using the rotor commutation magnets and position sensor mounted on the control device 80.

The measured id and iq values are fedback to the respective input id* and iq* current values, where an error value based on the difference between the measured id and iq currents and the driver torque demand (i.e. the id* and iq* current demand) is calculated.

The respective error values for id and iq are fed to the respective PI controller.

Based on the error values provided to the respective PI controller, the PI controllers determine the respective vd and vq values (i.e. the PI controller's manipulated variables) for driving the electric motor. The PWM voltage used to generate the ia, ib, and ic currents that flow in respective coil windings are derived from the vd and vq values via the use of an inverse Park Transform, as is well known to a person skilled in the art.

Although the present embodiment utilizes a PI controller feedback loop, any control loop feedback mechanism may be utilized.

A process for identifying fault conditions associated with an electric motor according to a first embodiment will now be described.

Using a model of an electric motor, which according to the present embodiment is a permanent magnet synchronous electric motor, an estimate of the motor id and iq current is calculated using the input vd and vq voltages generated by the respective PI controllers.

For example, a permanent magnet motor can be modeled using voltage equations:

$$v_d = R_s i_d - \omega_e L_{sq} i_q + L_{sd} \frac{di_d}{dt} \quad \text{(Equ. 1)}$$
$$v_q = R_s i_q + \omega_e L_{sd} i_d + \omega_e \psi_m + L_{sq} \frac{di_q}{dt}$$

where $R_s$ is the resistance of the respective stator coil windings, $L_{sd}$ and $L_{sq}$ are the components of inductance of the stator coil windings, $\omega_e$ is the electrical frequency and $\psi_m$ is the flux resulting from the permanent magnets.

Any suitable means for determining the values of $R_s$, $L_{sd}$, $L_{sq}$, $\omega_e$ and $\psi_m$ may be used, for example by measurement.

To provide expressions for the rate of change of current the voltage equations are rearranged as illustrated in Equ. 2.

$$\frac{di_d}{dt} = \frac{v_d - R_s i_d + \omega_e L_{sq} i_q}{L_{sd}} \quad \text{(Equ. 2)}$$
$$\frac{di_q}{dt} = \frac{v_q - R_s i_q - \omega_e L_{sd} i_d - \omega_e \psi_m}{L_{sq}}$$

To obtain an estimates for $i_d$ and $i_q$, Equ. 2 is integrated.

The estimated id and iq values may be used to provide an estimate for the torque generated by the motor using a torque equation, for example:

$$T_e = \frac{3}{2} N_P (\psi_m i_q + (L_{sd} - L_{sq}) i_d i_q) \quad \text{(Equ. 3)}$$

where $T_e$ is the electrical torque and $N_P$ is the number of motor pole pairs. As can be seen from Equ. 3, the torque generated by the electric motor is proportional to iq when id equals zero or $L_{sd}$ equals $L_{sq}$.

The estimated id and iq current values derived from equations 2 are compared with the measured id and iq current values.

If the difference between the estimated id and/or iq values and the measured id and/or iq values are greater than a first predetermined value a counter value is increased. Any suitable means may be used to identify the first predetermined value, for example by experimentation or based on specific faults that are induced in the electric motor. However, if the first predetermined value is set too low there will be a greater likelihood that transient conditions will be falsely identified as a fault. In contrast, if the first predetermined value is set too high failure conditions in the electric motor may not be identified.

If the difference between the estimated id and/or iq values and the measured id and/or iq values are less than the first predetermined value the counter value is decreased.

Although the present embodiment compares measured id and/or iq values with estimated id and iq values, a comparison may be made with other motor parameters, for example estimated and measured values of torque or power.

If the counter value exceeds a second predetermined value this indicates that there is a fault with the electric motor and a fault condition is triggered.

The frequency at which the comparison of the estimated and measured values is made will typically be based upon the amount of time before which a fault condition becomes critical. For example, if a fault condition needs to be identified within 500 ms and the comparison is performed every 100 ms, a count value of 5 would indicate that a fault has occurred. If the comparison is performed very 50 ms, a count value of 10 would indicate that a fault has occurred.

Any suitable fault notification may be utilised, for example a fault indicator may be set to notify the driver of the vehicle that the vehicle should be taken to a service/diagnostic centre and/or the performance of the electric motor may be limited, for example the motor torque may be reduced or a reduced maximum torque set.

Using a fault counter that is incremented and decremented based on the difference between estimated and measured current values has the advantage of minimising the risk of transient or noisy conditions being identified as a fault condition, where an out of tolerance condition is only identified as a fault if the condition continues for a predetermined time period or is identified a predetermined number of times.

In an alternative embodiment, for an electric motor having a plurality of sub-motors, as described above, the input vq and vd voltages for the respective sub-motors may be compared.

If the difference between the input vq and vd voltages between two sub-motors is greater than a first predetermined value a counter value is increased. As with the first embodiment, the first predetermined value can be determined by any suitable means. Preferably, to aid the location of a fault condition to a specific sub-motor the input vq and vd voltages for three sub-motors are compared.

If the difference between the respective vq and vd values are less than the first predetermined value the counter value is decreased.

Although, this embodiment compares respective sub-motor vq and vd values, a comparison may be made with other motor parameters, for example current.

If the counter value exceeds a second predetermined value this indicates that there is a fault with one or more of the sub-motors and a fault condition is triggered.

Any suitable fault condition may be utilised, for example a fault indicator may be set to notify the driver of the vehicle that the vehicle should be taken to a service/diagnostic centre and/or the performance of the electric motor may be limited, for example the motor torque may be reduced or a reduced maximum torque set.

Both of the embodiments for identifying a fault in an electric motor described above may be implemented in an electric motor together or separately.

The invention claimed is:

1. A control unit for identifying a fault in an electric motor or generator, the control unit comprising means for measuring a value of a first parameter associated with the operation of the electric motor or generator; means for increasing a counter value if the difference between the measured first parameter value or a value derived from the measured value and a second value is greater than a first predetermined value; means for decreasing the counter value if the difference between the measured first parameter value and the second value is less than the first predetermined value; and means for generating a signal indicative of a fault if the counter value exceeds a second predetermined value.

2. A control unit according to claim 1, further comprising means for calculating a value of the first parameter, wherein the second value is the calculated value of the first parameter.

3. A control unit according to claim 2, wherein the means for calculating is arranged to calculate the value of the first parameter using a value of a second parameter associated with the operation of the electric motor or generator.

4. A control unit according to claim 3, wherein the first parameter is a current generated in a coil winding of the electric motor or generator, and wherein the second parameter is a voltage.

5. A control unit according to claim 4, wherein the second parameter is a component of voltage.

6. A control unit according to claim 5, wherein the component of voltage is phase and/or amplitude or vd and/or vq.

7. A control unit according to claim 2, further comprising means for comparing the calculated value of the first parameter and the measured value of the first parameter.

8. A control unit according to claim 1, wherein the first parameter is a current generated in a coil winding of the electric motor or generator.

9. A control unit according to claim 8, wherein the first parameter is a component of current.

10. A control unit according to claim 8, wherein the value derived from the measured current is a value of id or iq.

11. A control unit according to claim 1, wherein the first parameter is a voltage.

12. A control unit according to claim 11, wherein the first parameter is a component of voltage.

13. A control unit according to claim 12, wherein the component of voltage is phase and/or amplitude or vd and/or vq.

14. A control unit according to claim 1, wherein the means for measuring is arranged to measure a value of a first parameter associated with the operation of a first sub motor of the electric motor, further comprising means for measuring a value of a first parameter associated with the operation of a second sub motor of the electric motor, wherein the second value is the measured value of the first parameter associated with the second sub motor.

15. A control unit according to claim 14, wherein the first parameter is a voltage or current generated in a coil winding of the electric motor or generator.

16. A control unit according to claim 15, wherein the first parameter is a component of voltage or current.

17. An electric motor system comprising an electric motor and a control unit, the control unit comprising means for measuring a value of a first parameter associated with the operation of the electric motor or generator; means for increasing a counter value if the difference between the measured first parameter value or a value derived from the measured value and a second value is greater than a first predetermined value; means for decreasing the counter value if the difference between the measured first parameter value and the second value is less than the first predetermined value; and means for generating a signal indicative of a fault if the counter value exceeds a second predetermined value.

18. An electric motor system according to claim 17, wherein the electric motor is a permanent magnet synchronous electric motor.

19. A method for identifying a fault in an electric motor or generator, the method comprising measuring a value of a first parameter associated with the operation of the electric motor or generator; increasing a counter value if the difference between the measured first parameter value or a value derived from the measured value and a second value is greater than a first predetermined value; decreasing the counter value if the difference between the measured first parameter value and the second value is less than the first predetermined value; and generating a signal indicative of a fault if the counter value exceeds a second predetermined value.

20. A method according to claim 19, further comprising calculating a value of the first parameter, wherein the second value is the calculated value of the first parameter.

21. A method according to claim 20, wherein the value of the first parameter is calculated using a value of a second parameter associated with the operation of the electric motor or generator.

22. A method according to claim 19, wherein the first parameter is a current generated in a coil winding of the electric motor or generator.

23. A method according to claim 22, wherein the first parameter is a component of current.

24. A method according to claim 22, wherein the value derived from the measured current is a value of id or iq.

25. A method according to claim 19, wherein the first parameter is a current generated in a coil winding of the electric motor or generator, wherein the second parameter is a voltage.

26. A method according to claim 25, wherein the second parameter is a component of voltage.

27. A method according to claim 26, wherein the component of voltage is phase and/or amplitude or vd and/or vq.

28. A method according to claim 19, wherein the first parameter is a voltage.

29. A method according to claim 19, wherein measured value of a first parameter is a measured value of a first parameter associated with the operation of a first sub motor of the electric motor, further comprising measuring a value of a first parameter associated with the operation of a second sub motor of the electric motor, wherein the second value is the measured value of the first parameter associated with the second sub motor.

\* \* \* \* \*